United States Patent [19]
Douty et al.

[11] Patent Number: 5,727,964
[45] Date of Patent: Mar. 17, 1998

[54] SYSTEM FOR REMOTE LATCHING AND DELATCHING

[75] Inventors: George Harold Douty, Mifflintown; John Michael Landis, Camp Hill; Hurley Chester Moll, Jr.; Michael David Long, both of Harrisburg, all of Pa.

[73] Assignee: The Whitaker Corporation, Wilmington, Del.

[21] Appl. No.: 640,294

[22] Filed: Apr. 30, 1996

[51] Int. Cl.[6] .................................................. H01R 13/62
[52] U.S. Cl. ........................................ 439/372; 439/358
[58] Field of Search ........................... 439/350, 362–364, 439/358, 372

[56] References Cited

U.S. PATENT DOCUMENTS

| | | | |
|---|---|---|---|
| 4,944,693 | 7/1990 | Puerner | 439/358 |
| 5,197,900 | 3/1993 | Ellis et al. | 439/358 X |
| 5,310,352 | 5/1994 | Mroczkowski et al. | 439/76 |
| 5,342,216 | 8/1994 | Davis et al. | 439/362 |
| 5,472,347 | 12/1995 | Nordenstrom et al. | 439/61 |
| 5,508,886 | 4/1996 | Bernecker et al. | 361/733 |

OTHER PUBLICATIONS

Wago Brochure, "Wago I/O System Fieldbus Independent Bus Terminal Blocks", Apr. 1996, six pages. Wago Corporation, Brown Deer, WI.

*Primary Examiner*—Khiem Nguyen
*Attorney, Agent, or Firm*—Anton P. Ness

[57] ABSTRACT

A system for latching and delatching a first article (14) to and from respectively of a second article (12), having a latch member (18,20) with an elongated shaft (28) and an actuator (34) at a trailing end (36) and a latch (30) projecting laterally from a leading end (32). The leading end (32) extends beyond the end of a passageway (64,66) containing the shaft (28) to cooperate with a ledge (40) of the second article for latching. Manipulation of the actuator (34) at the rearward end (26) of the first article (14) enables latching and delatching of the latch (30) with the ledge (40), thereby enabling remote latching and delatching of said first article with and from said second article.

17 Claims, 11 Drawing Sheets

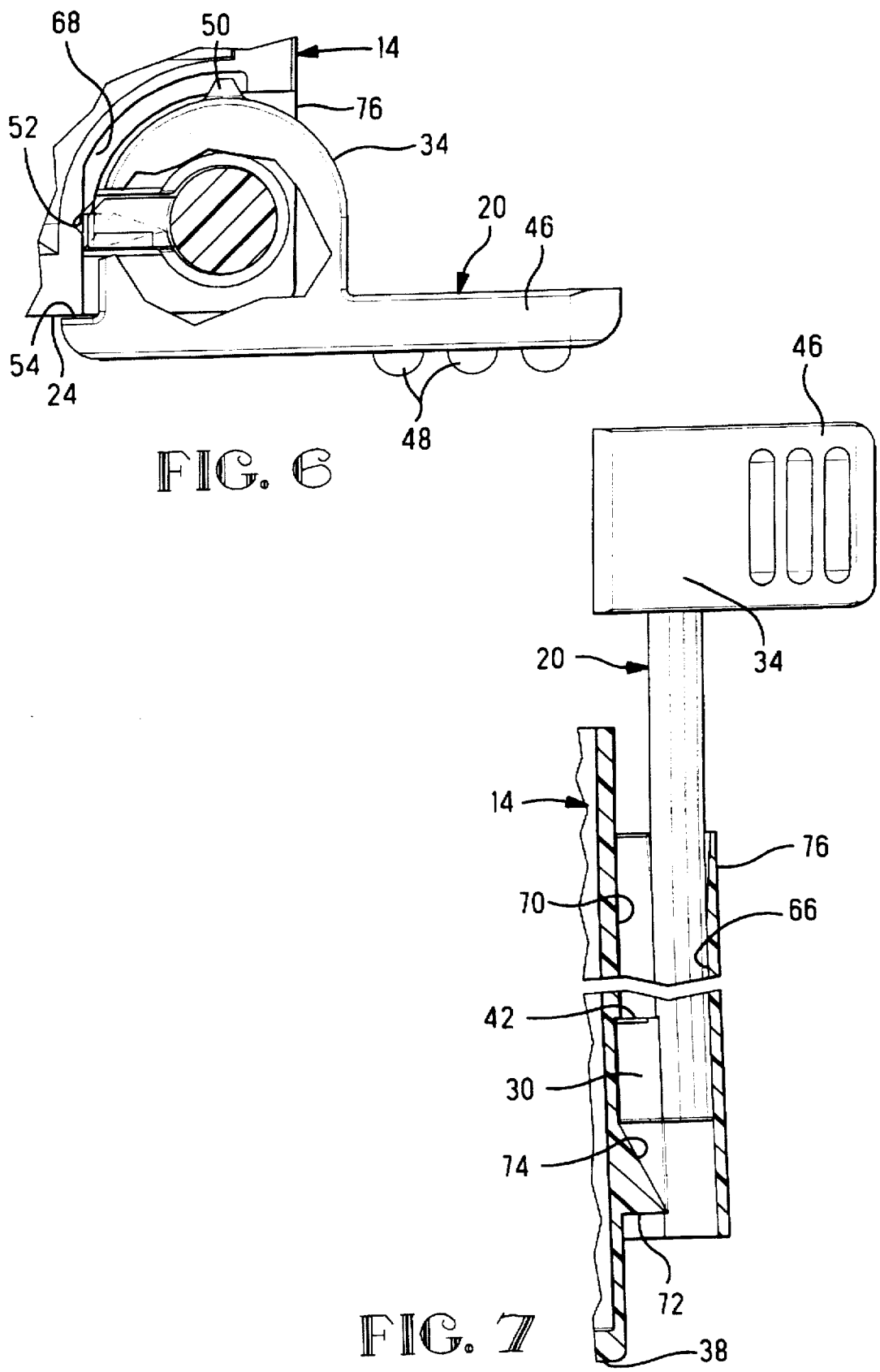

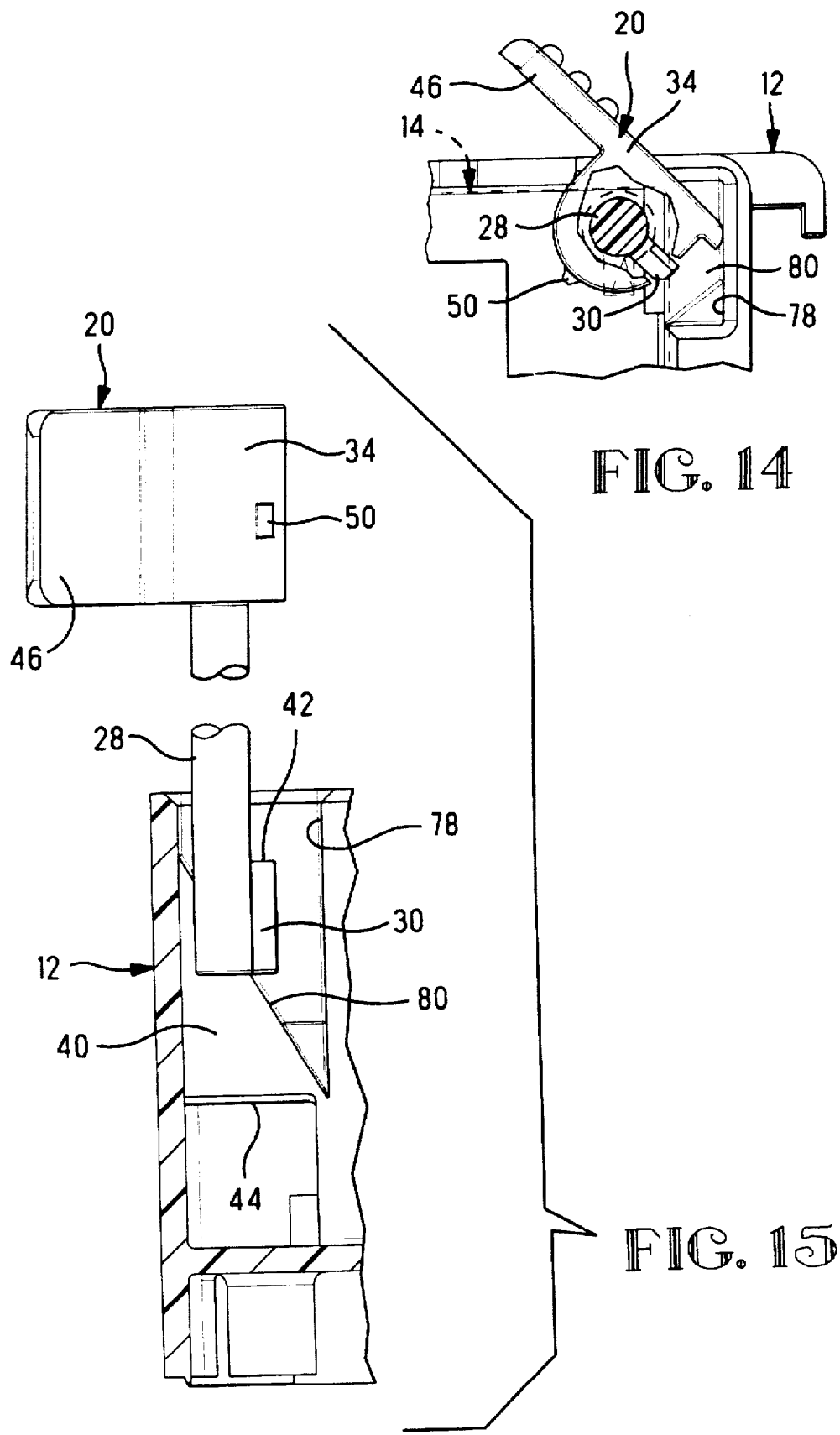

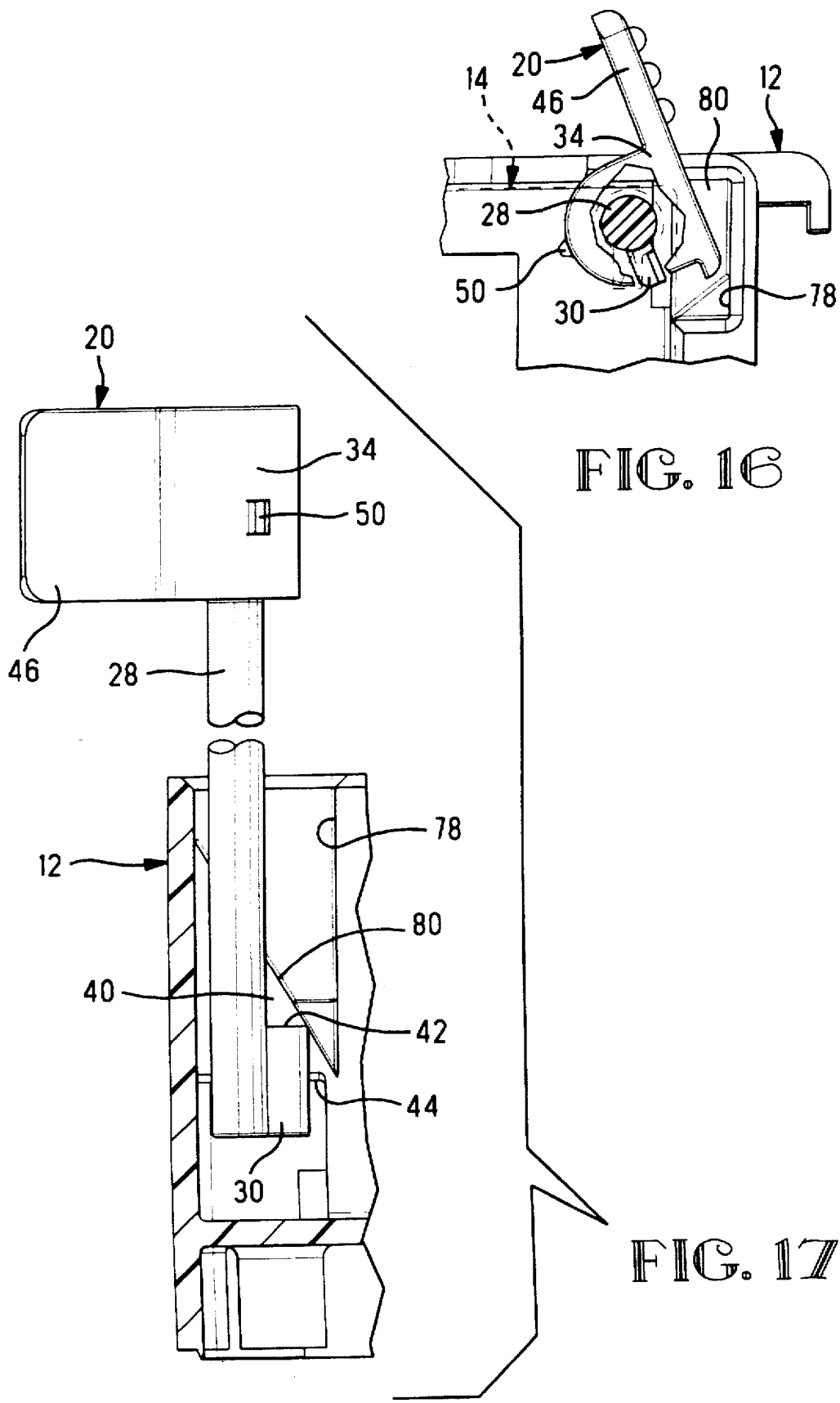

SYSTEM FOR REMOTE LATCHING AND DELATCHING

FIELD OF THE INVENTION

The present invention is directed to affixing two articles together and more particularly to latching the articles together in a manner permitting delatching.

BACKGROUND OF THE INVENTION

Electrical connectors commonly utilize latching as a means to hold a pair of articles to each other upon assembly or upon connector mating, and usually does so in a manner permitting delatching. When a pair of complementary connectors are mated together, at least one of them includes a latch arm having a latch therealong that seats behind a projection or into a recess of the other, and also having an actuator section that enables manipulation to pivot the latch arm about a fulcrum to unseat the latch enabling unmating of the connectors when desired. One such connector pair with such a latching arrangement is disclosed in U.S. Pat. No. 4,944,693. A pair of latch arms is disposed on opposed sides of the housing of a first connector, with a latch defined on the leading end of each arm and a manually engageable actuator section defined on the rearward end so that the pair of actuator sections are compressible toward the housing and each other when gripped thus pivoting the leading ends outwardly to become delatched from the cooperating latching portion of the mating connector, permitting the connectors to be pulled apart for unmating.

It is desired to provide a latching system that enables delatching where neither tool-assisted prying of the latch nor pivoting of a latch arm about a fulcrum by manipulation of an actuator is not feasible.

SUMMARY OF THE INVENTION

The present invention provides a latch member that includes an actuator positioned remotely from a latch, enabling manipulation of the actuator for delatching.

A latch member of the present invention includes an elongate shank extending from a latch at a first end to an actuator at a second end. A passageway is provided along a first article, such as a housing of an electronics module, extending from a rear end to a front end, where the housing is to be latched to a second article, such as a base member, along the housing front end. The base member includes a cooperating ledge adjacent the passageway such that a latch member inserted into the passageway for its leading end to extend therebeyond, positions the latch alongside the cooperating ledge to become latched and delatched therewith upon manipulation of the actuator. Movement of the actuator at the rear end of the housing between first and second positions corresponds to latched and delatched positions of the latch at the forward end of the housing.

An embodiment of the present invention will now be described by way of example with reference to the accompanying drawings.

BRIEF DESCRIPTION OF THE DRAWINGS

FIGS. 6 and 7 are plan and elevation section views of the latch member partially inserted into the passageway of the housing of FIGS. 4 and 5, with FIG. 6 partially broken away to reveal the latch in the passageway, and with FIG. 7 taken along lines 7—7 of FIG. 4;

FIGS. 14 and 15 are similar to FIGS. 12 and 13 with the latch member having been partially rotated upon engagement with a camming surface of the base;

FIGS. 16 and 17 are similar to FIGS. 12 to 15 with the latch member having been fully rotated by the camming surface to pass the ledge prior to latching.

DETAILED DESCRIPTION

Figure 1:
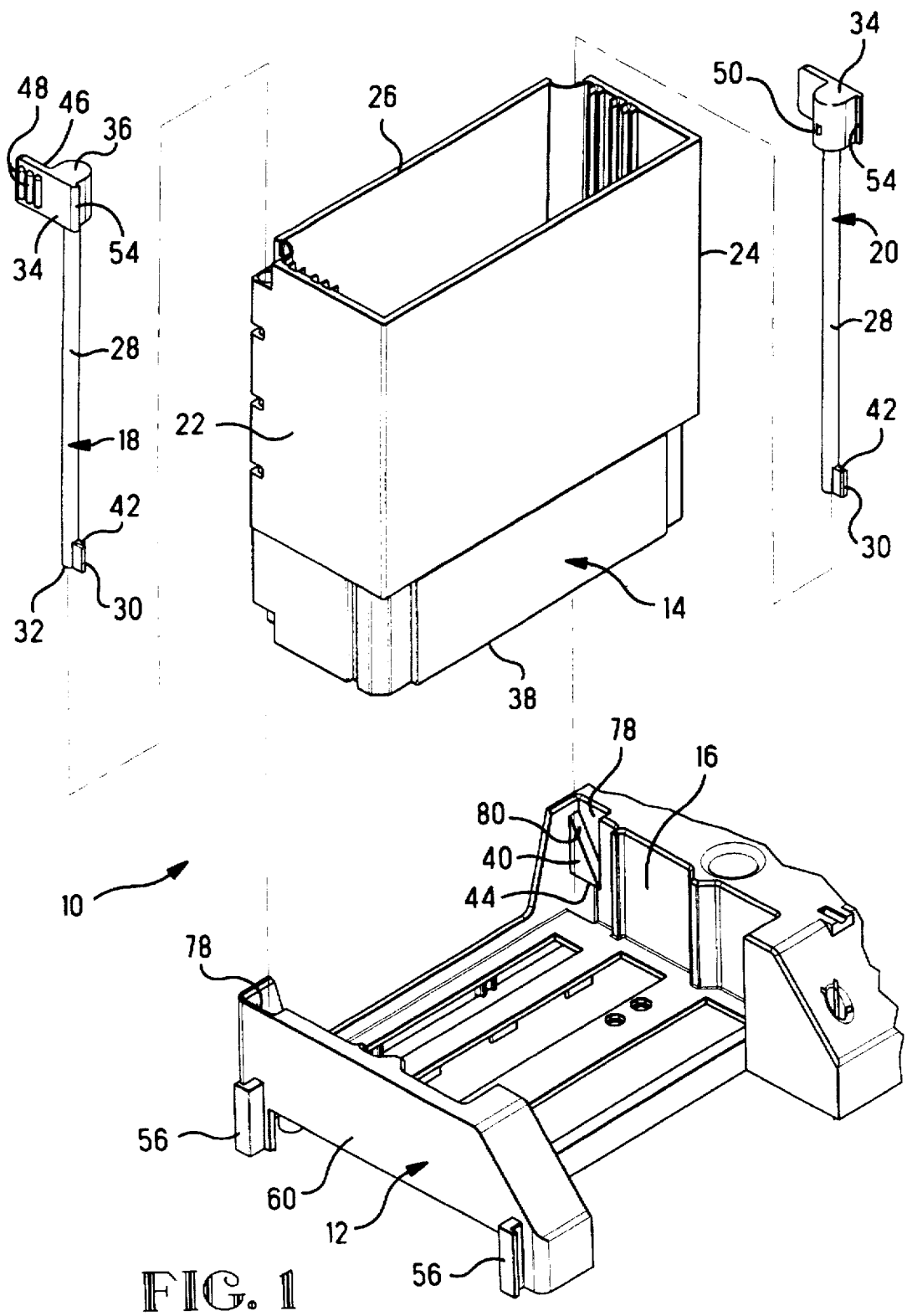
FIG. 1 is an exploded isometric view of the assembly containing the present invention, with a housing to be latched to a base and having a pair of latch members.

In FIGS. 1 to 6 an electronic module assembly 10 is shown to include a base 12, a housing 14 to be secured at a module site 16 of the base, and a pair of latch members 18, 20 to be utilized to latch the housing to the base at respective ends 22, 24 of housing 14. Base 12 is seen to provide sites for other modules thereto to define a larger assembly, and further is adapted to be placed into an elongate closely spaced array of other such larger assemblies. The close spacing precludes a possibility of having access to the base to delatch a selected module therefrom either manually or with the assistance of standard tools. The present invention provides an actuator that is remote from the base by being positioned at the top face 26 of housing 14 for manual access thereto in a closely spaced array. In the FIGURES, the circuit boards and electronic components, connectors and terminals are not shown, but electrical connections would be established along the bottom face of the housing, disposed adjacent to openings in the base upon full assembly.

Latch members 18, 20 each include an elongated shaft 28, a latch 30 comprising an embossment extending laterally from a first or leading end 32 of the latch member, and an actuator 34 positioned at second or trailing end 36. Latch 30 extends beyond a bottom face 38 of housing 14 and into module site 16 to cooperate with a ledge 40 defined in base 12 to latch housing 14 to base 12 upon complete assembly. Each latch 30 includes a rearwardly facing latching surface 42 that seats beneath a forwardly facing latching surface 44 of ledge 40 when the latch member has been actuated to a latched position.

Figure 18:
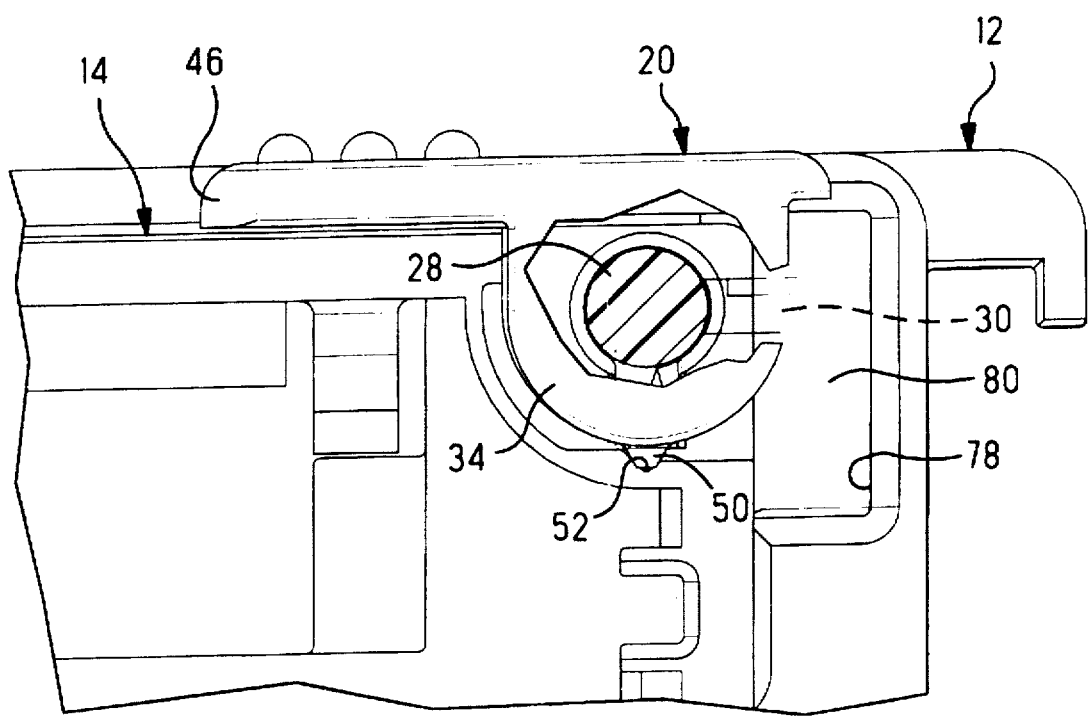
FIGS. 18 and 19 are similar to FIGS. 12 to 17 with the latch member actuated for the latch to become latched under the ledge and securing the housing to the base.
Figure 19:
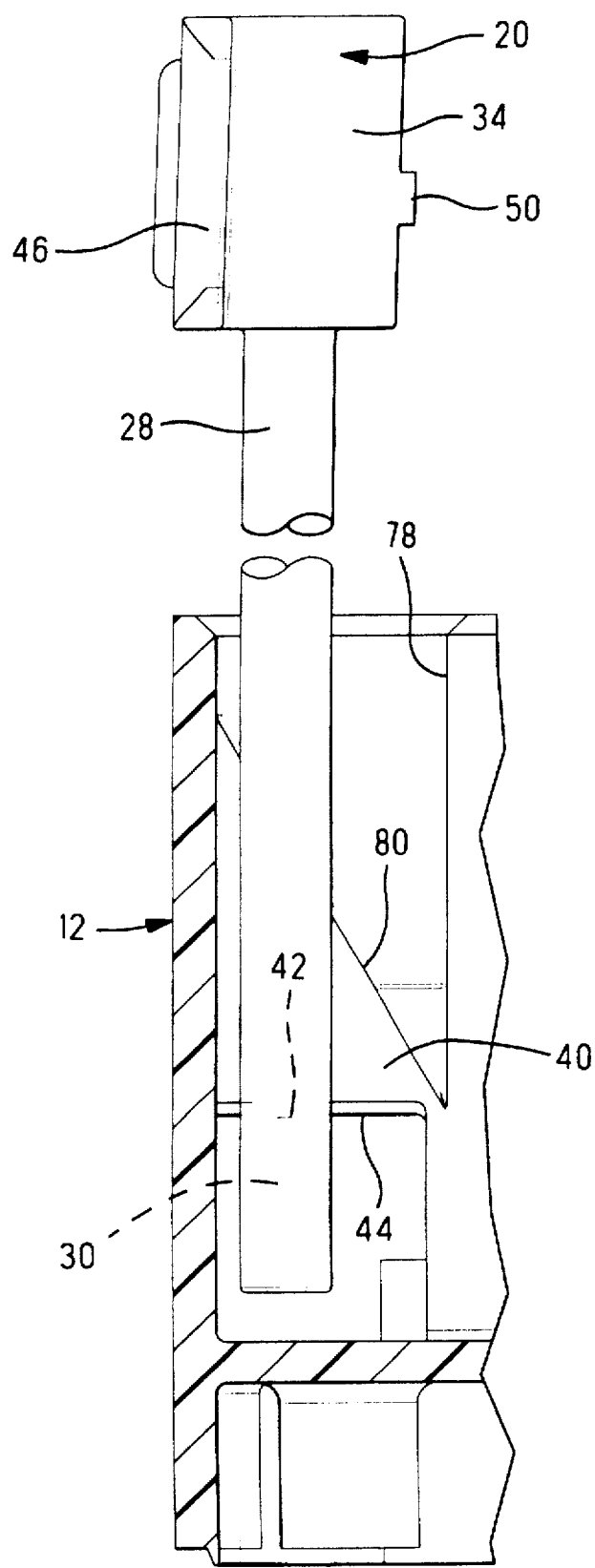

Actuator 34 is seen to include a flange 46 extending laterally from trailing end 36 that is adapted for manual engagement by means of ridges 48, and the actuator further includes a protuberance 50 that cooperates with a detent 52 of housing 14 (FIG. 6) to maintain the latch member in a fully latched position upon complete assembly of housing 14 to base 12 as illustrated in FIGS. 18 and 19. Protuberance 50 is shown to be slightly larger than detent 52 thus seating therewithin in an interference fit, slightly elastically deforming the sidewalls of detent 52 to assure a vibration-resistant seating arrangement. Actuator 34 also is shown to have a stop surface 54 that cooperates with the surface of end 24 of housing 14 to prevent further rotation when actuator is in a fully unlatched position as shown in FIG. 6, with the latching system shown to provide a quarter turn of movement between the fully latched and fully unlatched positions.

Figure 2:
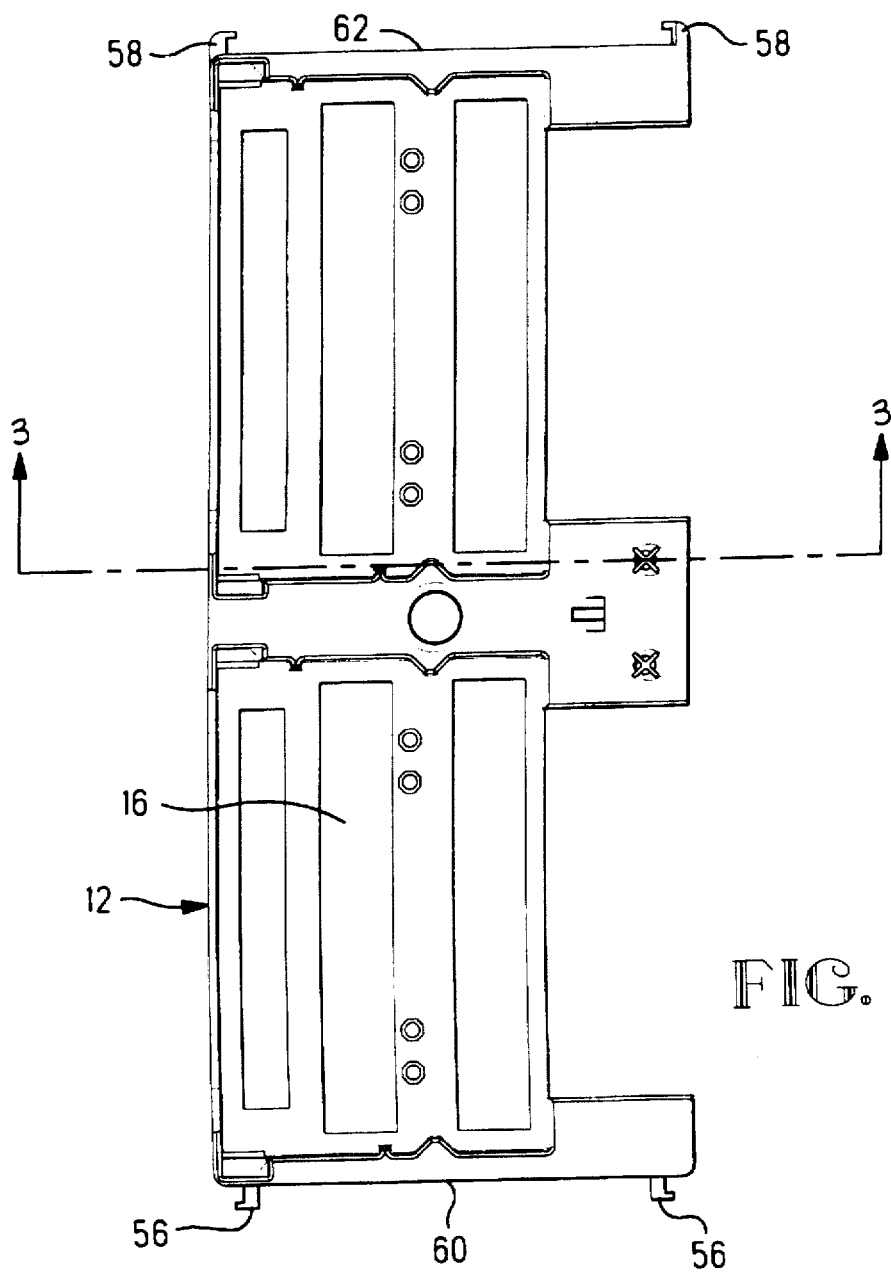
FIGS. 2 and 3 are a plan view and section view of the base member, with FIG. 3 taken along lines 3—3 of FIG. 2.
Figure 3:
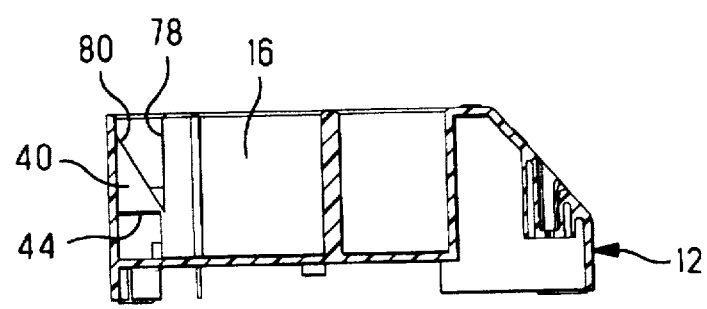

In FIG. 2 base 12 is seen to have complementary interlocking tabs 56, 58 at respective ends 60, 62 to enable interlocking with bases of other similar assemblies in a closely spaced array.

Figure 4:
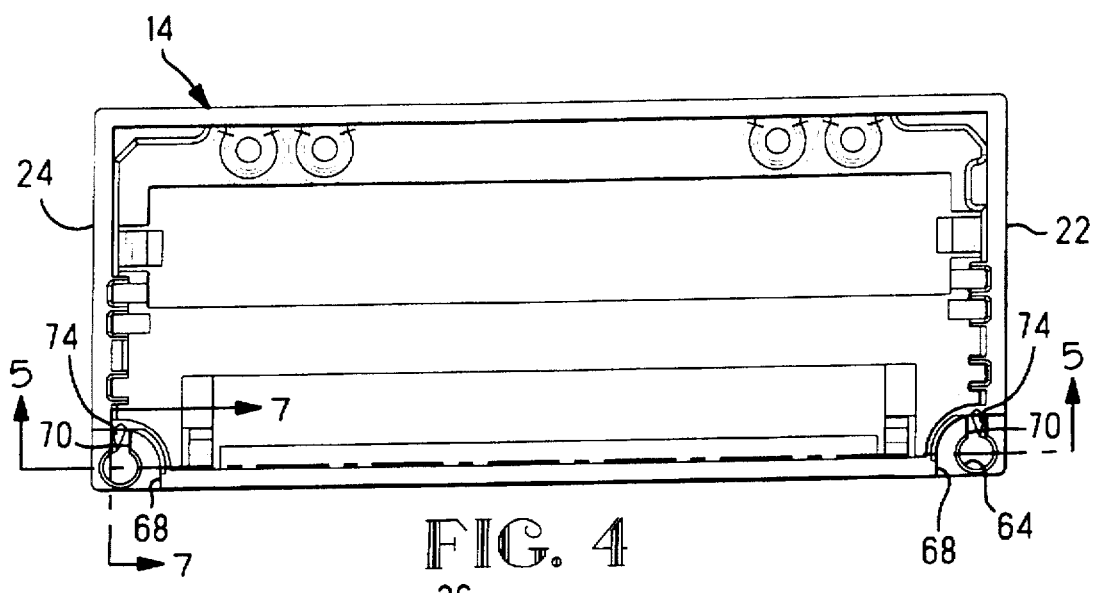
FIGS. 4 and 5 are plan and elevation section views of the housing, with FIG. 5 taken along lines 5—5 of FIG. 4 and showing the passageways into which the latch members of FIG. 1 are to be inserted.
Figure 5:
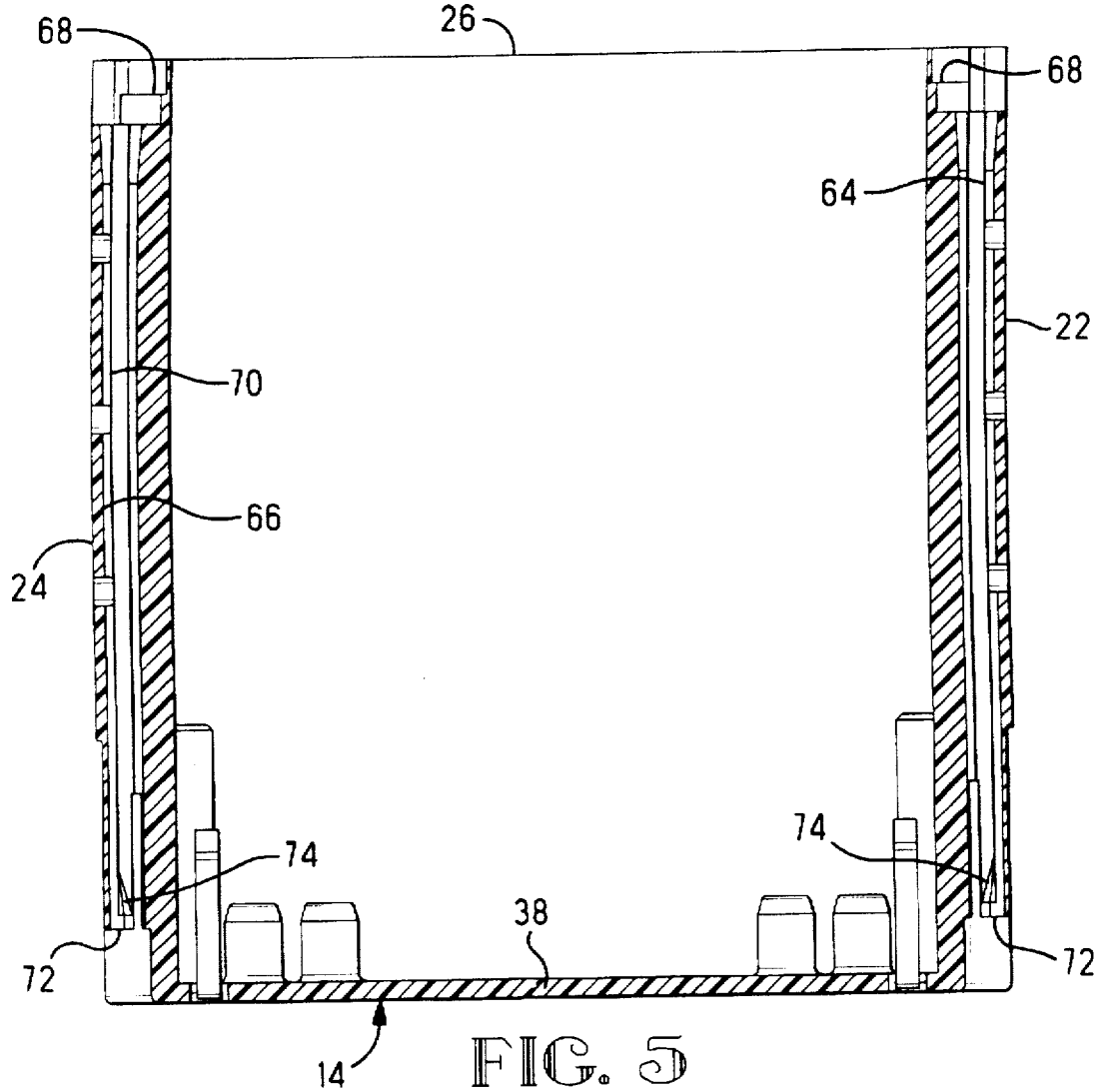
Figure 8:
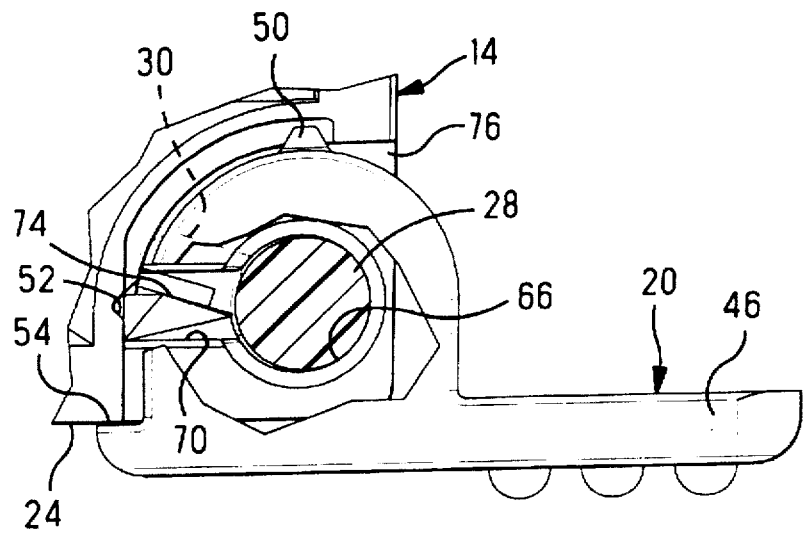
FIGS. 8 and 9 are similar to FIGS. 6 and 7 with the latch member further inserted and subjected to twisting from torsion.
Figure 9:
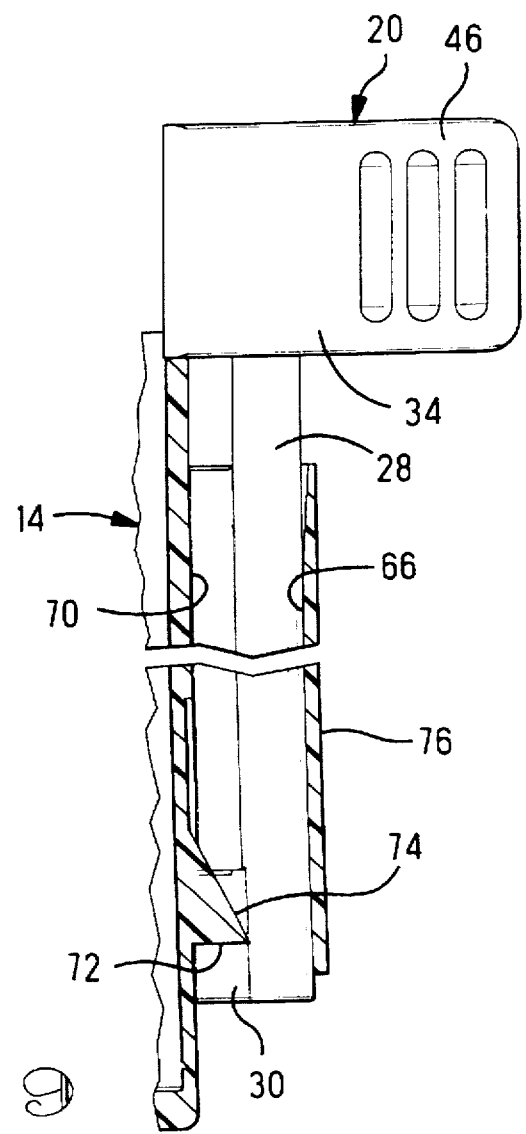

In FIGS. 4 and 5, housing 14 is shown to include latch-receiving passageways 64, 66 extending from top face 26 to bottom face 38. The upper entrance to each of the passageways is a recess 68 in which the actuator of the latch member is disposed when shaft 28 and latch 30 have been fully inserted through the respective passageway. Each passageway is generally sized to complement shaft 28 of the latch member but includes an adjacent channel 70 therealong permitting passing of latch 30 therealong during insertion of the latch member into the respective passageway of the housing.

In one aspect of the present invention, each passageway of housing 14 preferably includes a ledge 72 adjacent to bottom face 38 to assure retention of a latch member in the respective passageway once fully inserted, with latch 30 being retained beneath ledge 72 although extending substantially therepast. To assure that the latch is maintained in a particular angular position thus remaining beneath ledge 72, the passageway preferably includes a camming surface 74 proximate the exit of the passageway, with the camming surface positioned along channel 70 to be assuredly engaged by the latch projection during assembly.

Referring to FIGS. 4 to 11, latch member 20 is shown positioned with actuator 34 extending rearwardly beyond rear housing wall 76. With the cooperation of the actuator stop surface 54 abutting against the housing end preventing rotation of the shaft 28, latch projection 30 bears against camming surface 74 to be forced laterally thus applying torque to shaft 28. With latch member 20 being fabricated of resilient plastic material (such as NORYL polyphenylene oxide modified resin, sold by General Electric, or glass-filled polyester), the shaft becomes elastically twisted or angularly deflected temporarily along its elongated length permitting the latch projection to rotate while the actuator 34 at the trailing end 36 to maintain a constant angular position, seen in FIGS. 8 and 9 in which latch projection 30 is shown partially in phantom.

Figure 10:
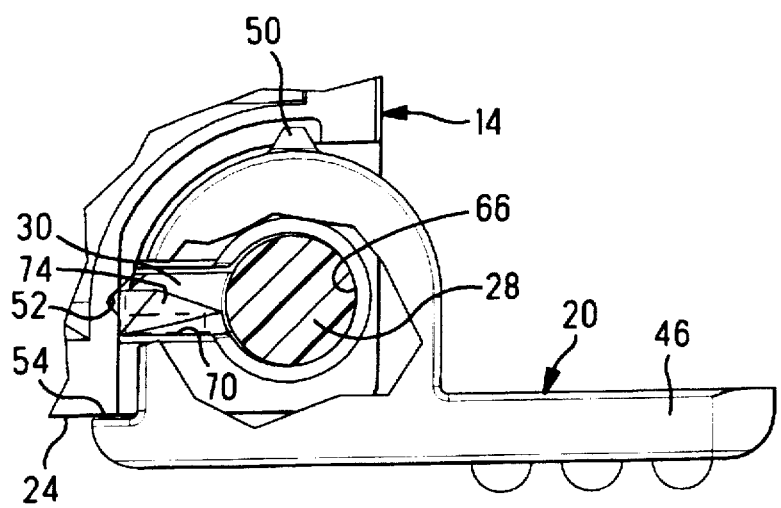
FIGS. 10 and 11 are similar to FIGS. 6 to 9 with the latch member fully inserted through the passageway.
Figure 11:
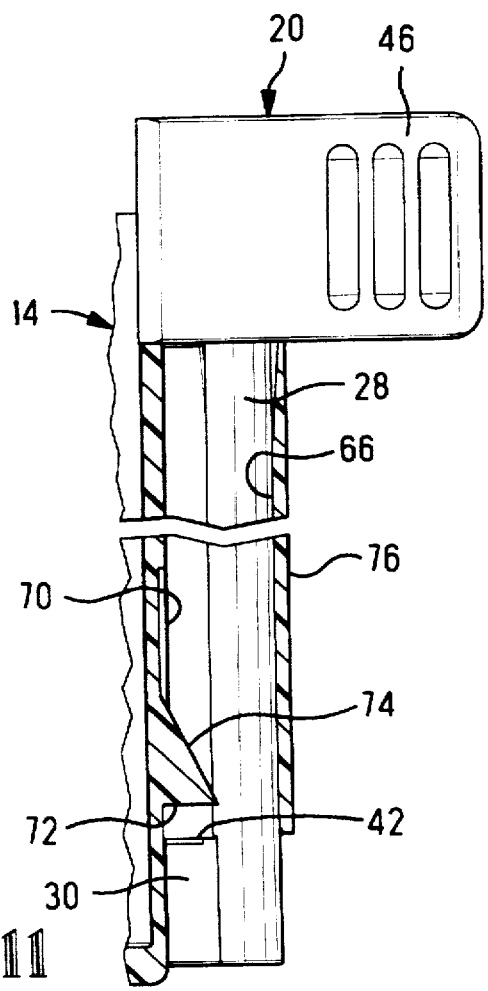
Figure 12:
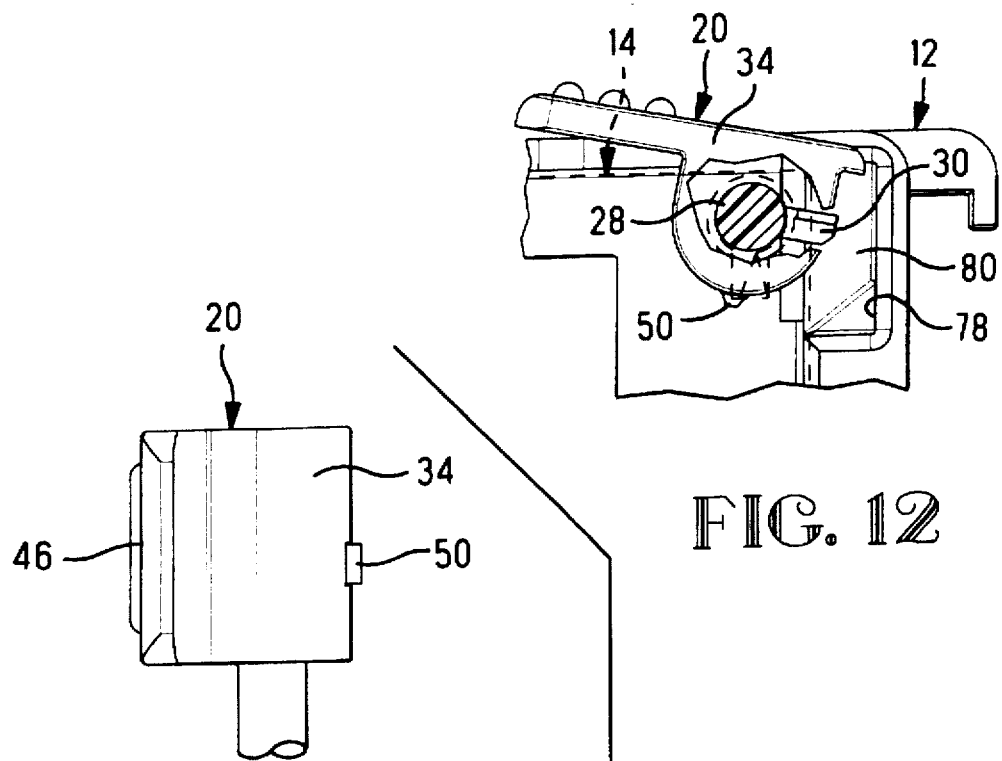
FIGS. 12 and 13 are plan and elevation section views of the latch member in the housing with the housing being positioned on the base and the latch poised to be received thereinto, with FIG. 12 partially broken away to reveal the latch in the housing passageway.
Figure 13:
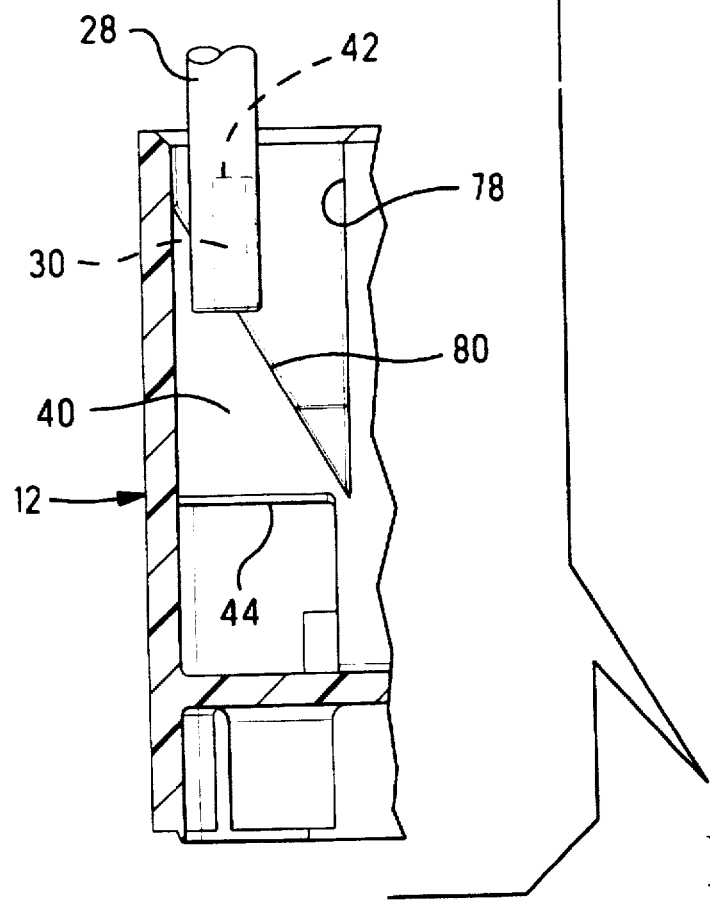

Upon further latch member insertion, as seen in FIGS. 10 and 11 the latch projection passes ledge 72 and snaps to return to its untorqued angular position and is seated beneath the ledge. As can be discerned, the latch projection would be unable to become inadvertently dislodged from beneath the ledge, and the latch member remains affixed to the housing.

Referring now to FIGS. 12 to 19, a housing 14 (in phantom in FIGS. 12, 14, 16 and 18) is being affixed to base 12 using latch member 20 in cooperation with ledge 40. For clarity to demonstrate the activity of latch member 20 with respect to base 12, housing 14 is not shown in FIGS. 13, 15, 17 and 19. Latch 30 is received into a recess 78 initially above an angled bearing surface 80 defining the upper surface of ledge 40. Actuator 34 of latch member 20 is free to rotate within a 90 degree range during initial insertion of latch 30 into recess 78. When latch 30 engages bearing surface 80, it is urged clockwise until shaft 28 is rotated for latch 30 to become parallel to the side surface of ledge 40 to pass thereby, as seen in FIGS. 12 to 15, as actuator 34 is correspondingly rotated within recess 68 until flange 46 extends orthogonally outwardly of housing 14 beyond the rear wall of the housing.

Upon latch 30 passing by ledge 40, at which time housing 14 is positioned on base 12, rearwardly facing latch surface 42 of latch 30 is aligned with forwardly facing surface 44 of ledge 40. Actuator 34 is now rotatable clockwise for flange 46 to become parallel to side surface 24 of the housing and protuberance 50 is received and seated within detent 52, which causes latch 30 to become latched under ledge 40. Preferably a pair of latch members 18, 20 is utilized with each housing thus latching the housing to the base at a pair of opposed spaced locations. Latch member 18 may be a mirror image of latch member 20, with corresponding portions of the housing and base being similarly mirror image, such that latch member 18 is rotatable in opposed angular directions from latch member 20.

Modifications and variations may be made to the embodiment disclosed herein, that are within the spirit of the invention and the scope of the claims.

What is claimed is:

1. A system for latching and delatching a first article to a second article, comprising:

at least one latch member movably affixed to said first article and having an actuator section at a trailing end of an elongated shaft and further having a latch projection projecting laterally from a leading end of said shaft and defining a latch surface;

said first article including a passageway extending therethrough from a rearward end to a forward end and shaped and dimensioned to permit insertion of a respective each said at least one latch member therethrough and therealong such that said actuator is disposed at said rearward end and exposed for manipulation thereof, said leading end of said latch member shaft extends outwardly from a forward end of a respective said passageway, and said latch member is rotatably movable within said passageway; and said second article includes a latch-receiving recess extending into a face thereof and associated with each said at least one latch member and including a cooperating latch along said latch-receiving recess defining a cooperating latch surface cooperable with said latch surface of said latch projection of said latch member, whereby upon mounting of said first article to said second article, said leading end of each said at least one latch member extends along a corresponding said latch-receiving recess for said latch projection to become latchingly engaged with said cooperating latch upon manipulation of said actuator of said latch member at said rearward end of said first article.

2. The system as set forth in claim 1 wherein at least a pair of said latch members are movably affixed to said first article, each proximate opposed sides thereof, for enabling latching to said second article at a pair of spaced locations.

3. The system as set forth in claim 1 wherein said actuator includes a protuberance cooperable with a detent of said first article defining a fully latched position for retaining said actuator in said fully latched position.

4. The system as set forth in claim 1 wherein said actuator is seated within a recess of said first article along said rearward face thereof.

5. The system as set forth in claim 1 wherein said actuator includes a flange extending laterally therefrom facilitating manipulation thereof.

6. The system as set forth in claim 1 wherein said latch member is formed of a durable, resilient thermoplastic material.

7. The system as set forth in claim 1 wherein said latch-receiving recess of said second article includes a bearing surface offset from said latch member shaft and adapted to engage a said latch projection not properly oriented to pass by said cooperating latch prior to latching engagement therewith, to cause rotation of the latch member to adjust the orientation of said latch projection to pass by said cooperating latch, during mounting of said first article to said second article.

8. The system as set forth in claim 7 wherein said latch surface faces rearwardly, said cooperating latch surface faces forwardly, said bearing surface is angled and said latch member is rotatable within said passageway of said first article so that said latch projection is urged laterally by said bearing surface thus rotating said shaft in a first angular direction to adjust the angular position of said latch projection to pass by said cooperating latch, and said latch member is thereafter rotatable through manipulation of said actuator in an opposed second angular direction to become latchingly engaged with said cooperating latch and in said first angular direction to become delatched.

9. The system as set forth in claim 1 wherein said latch member shaft is cylindrical and is rotatable within a respective said passageway having a correspondingly cylindrical cross-section.

10. The system as set forth in claim 9 wherein said first article includes a channel along said passageway permitting passing of said latch projection during insertion of said latch member into said passageway.

11. The system as set forth in claim 10 wherein said forward end of said passageway defines a forwardly facing surface cooperable with said latch projection to inhibit rearward movement of said latch member after full insertion through said passageway.

12. The system as set forth in claim 11 wherein said channel of said passageway includes a camming surface adjacent said forward end thereof engageable by said latch projection during insertion along said passageway to cause rotation of the latch member to adjust the orientation of said latch projection in a selected angular direction prior to exiting a forward end of said channel during latch member insertion.

13. The system as set forth in claim 12 wherein said actuator is adapted to cooperate with said rearward face of said first article during latch member insertion through said passageway to prevent movement in said selected angular direction during said adjustment of said latch projection in said selected angular direction by said camming surface, thereby applying torque to said latch member shaft resulting in sufficient twisting thereof to angularly deflect said latch projection until passing beyond said forwardly facing surface at said forward end of said passageway, whereafter said latch projection returns to its untorqued position forwardly of said forwardly facing surface thereby abutting therewith to prevent dislodgment of said latch member from said first article upon inadvertent rearward movement of said latch member.

14. The system as set forth in claim 13 wherein said actuator includes a stop surface abuttable against a surface of said first article to prevent said movement thereof in said selected angular direction during said camming of said latch projection during latch member insertion.

15. The system as set forth in claim 1 wherein:

said latch member shaft is cylindrical and is rotatable within a respective said passageway having a correspondingly cylindrical cross-section;

said first article includes a channel along said passageway permitting passing of said latch projection during insertion of said latch member into said passageway;

said forward end of said passageway defines a forwardly facing surface cooperable with said latch projection to inhibit rearward movement of said latch member after full insertion through said passageway;

said channel of said passageway includes a camming surface adjacent said forward end thereof engageable by said latch projection during insertion along said passageway to adjust the orientation of said latch projection in a selected angular direction prior to exiting a forward end of said channel during latch member insertion;

said actuator is adapted to cooperate with said rearward face of said first article during latch member insertion through said passageway to prevent movement in said selected angular direction during said adjustment of said latch projection in said selected angular direction by said camming surface, thereby applying torque to said latch member shaft resulting in sufficient twisting thereof to angularly deflect said latch projection until passing beyond said forwardly facing surface at said forward end of said passageway, whereafter said latch projection returns to its untorqued position forwardly of said forwardly facing surface thereby abutting therewith to prevent dislodgment of said latch member from said first article upon inadvertent rearward movement of said latch member;

said latch-receiving recess of said second article includes a bearing surface offset from said latch member shaft and adapted to engage a said latch projection not properly oriented to pass by said cooperating latch prior to latching engagement therewith, to adjust the orientation of said latch to pass by said cooperating latch projection, during mounting of said first article to said second article; and said bearing surface is angled and said latch member is rotatable within said passageway of said first article so that said latch projection is urged laterally by said bearing surface thus rotating said shaft in an angular direction opposed to said selected angular direction to adjust the angular position of said latch projection to pass by said cooperating latch and also moving said stop surface of said actuator out of engagement with said surface of said first article, and said latch member is thereafter rotatable through manipulation of said actuator in said selected angular direction to become latchingly engaged with said cooperating latch and in said opposed angular direction to become delatched.

16. The system as set forth in claim 15 wherein said actuator includes a protuberance engageable with a detent of said first article to secure said actuator in a fully latched position.

17. The system as set forth in claim 15 wherein a flange of said actuator extends laterally facilitating manual engagement for manipulation of said actuator, and is positioned on said actuator to be parallel with a surface of said first article when said actuator is in said fully latched position.

* * * * *